(12) United States Patent
Nowka

(10) Patent No.: US 6,545,512 B2
(45) Date of Patent: Apr. 8, 2003

(54) LOW LEAKAGE SLEEP MODE FOR DYNAMIC CIRCUITS

(75) Inventor: Kevin John Nowka, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/931,303

(22) Filed: Aug. 16, 2001

(65) Prior Publication Data
US 2003/0034830 A1 Feb. 20, 2003

(51) Int. Cl.[7] .................................................. H03B 1/00
(52) U.S. Cl. ...................................................... 327/108
(58) Field of Search ................................. 327/427, 108; 326/95, 96

(56) References Cited

U.S. PATENT DOCUMENTS 5,841,304 A * 11/1998 Tam ............................ 327/161
5,900,759 A * 5/1999 Tam ............................. 326/28
6,121,796 A * 9/2000 Ciraula et al. ............... 326/121
6,377,080 B1 * 4/2002 Arnold ......................... 326/121
6,404,235 B1 * 6/2002 Nowka et al. ................. 326/95

* cited by examiner

Primary Examiner—Jeffrey Zweizig
(74) Attorney, Agent, or Firm—Anthony V. S. England; Casimer K. Salys

(57) ABSTRACT

In one aspect, a method for a sleep mode in a dynamic circuit includes driving a dynamic node to an operating voltage state during a precharge interval by precharge timing circuitry coupled to the dynamic node and a voltage source responsive to a precharge signal. The dynamic node is selectively pulled to a low voltage state during an evaluation interval by input circuitry coupled to the dynamic node responsive to one or more input signals. The dynamic node voltage is inverted by output circuitry coupled to the dynamic node and to an output node. The output node is isolated from ground during a sleep interval responsive to a sleep signal by sleep circuitry coupled to the output circuitry.

12 Claims, 4 Drawing Sheets

LOW LEAKAGE SLEEP MODE FOR DYNAMIC CIRCUITS

BACKGROUND OF THE INVENTION

1. Field of the Invention

The present invention relates to dynamic logic circuits, and more particularly to dynamic logic circuits having circuitry for a reduced power consumption state.

2. Related Art

Due to its speed, it is well known to use dynamic circuitry for high-performance applications. FIG. 1 illustrates a prototypical prior art dynamic logic circuit 100. The circuit 100 has a dynamic node 150 which is precharged to a high voltage during a precharge phase timed by clock 115. Then during an evaluation phase, also timed by clock 115, the dynamic node 150 may be selectively pulled down to a low voltage through input circuitry 122, depending on the state of the inputs.

More specifically, during the phase of clock 115 when the clock signal is low, PFET 101 in timing circuitry 120 is turned on and NFET 108 is turned off, which pulls dynamic node 150 up to Vdd. Then during the evaluation phase, that is, during the phase of clock 115 when the clock signal is high, PFET 101 is turned off and NFET 108 is turned on, so that the dynamic node 150 may be selectively pulled down to a low voltage through the NFET's 110 through 107 of input circuitry 122, depending on the state of the inputs on the gates 110 through 113.

The dynamic circuit 100 of FIG. 1 is a "domino" type of dynamic circuit, which includes an output stage, output circuitry 124, that enables chaining a number of dynamic circuits in series, or series-parallel combinations. That is, output circuitry 124 is a static gate which converts the state of the dynamic node 150 so that when the dynamic node 150 is in the precharged state the output signal on node 114 is low. Thus, even if the foot FET 108 is omitted in the next stage, the output 114 may be an input to a next dynamic logic circuit in a series without interfering in the pre charging of the dynamic node in the next dynamic logic circuit.

The dynamic circuit 100 also has keeper circuitry 126 coupled to the output 114, Vdd, and the dynamic node 150 for keeping the dynamic node at the precharged state during the evaluation phase despite leakage through the input circuitry 122 and the foot device 108 if none of the inputs are active.

It is known in low power consumption applications to have a "sleep" mode during which the logic circuitry is nonfunctional, or at least has a reduced functionality, and has reduced power consumption. Conventionally, dynamic logic circuits have not been as widely used as have static logic circuits in applications requiring low-power consumption. However, there is a current trend requiring higher performance for embedded processors in applications such as personal digital assistants, cell phones, electronic books, watches, etc. This is particularly brought on by the demand for rendering of images by such devices, such as for Internet browsers. The embedded processors in these applications are frequently battery powered, so there is an increasing need for reduced power consumption in dynamic logic circuits.

SUMMARY OF THE INVENTION

The foregoing need is addressed in the present invention, according to which a dynamic circuit includes a sleep mode cutoff transistor coupled to an inverter stage to minimize power consumption.

More particularly, the dynamic circuit includes a dynamic node and precharge timing circuitry. The precharge timing circuitry is coupled to the dynamic node and a voltage source for driving the dynamic node to a operating voltage state during a precharge interval responsive to a precharge signal. The dynamic circuit further includes input circuitry coupled to the dynamic node for selectively pulling the dynamic node to a low voltage state during an evaluation interval responsive to one or more input signals, and output circuitry coupled to the dynamic node and to an output node for inverting the dynamic node voltage. Also, sleep circuitry coupled to the output circuitry is operable to isolate the output node from ground during a sleep interval responsive to a sleep signal. It is an object of the invention for power consumption of the circuitry to be reduced in the sleep mode. The circuitry may use somewhat more power in the sleep mode than it does if power to the circuitry is merely turned off, but if power to the circuitry is turned off the circuitry has indeterminate voltage states. Therefore, the sleep mode is advantageous because in the sleep mode the circuitry uses less power than in normal operation and the circuitry has a determinate state.

In a further aspect, during the sleep interval, in which the sleep circuitry isolates the output node from ground responsive to the sleep signal, the circuitry is operable to pull the dynamic node signal to ground and drive the output signal to the operating voltage state.

In a still further aspect, the precharge signal drives to a voltage level above that of the operating voltage during the sleep interval, so that leakage current through the precharge timing circuitry is reduced during the sleep interval. That is, in an embodiment the gate voltage of a PFET in a leakage path is driven to the higher voltage level, turning the PFET off more fully.

In yet another aspect, the sleep signal goes to a voltage level below ground during the sleep interval, so that leakage current through the output circuitry is reduced during the sleep interval. That is, in an embodiment the gate voltage of an NFET in a leakage path is driven to the lower voltage level, turning the NFET off more fully.

Not all of the transistors in a leakage path are necessarily driven more fully off. For example, a keeper PFET provides a leakage path, but in an embodiment this transistor's gate is not driven above the operating voltage for the sleep because the keeper PFET is a relatively small device, much smaller than the pre charge PFET, so it's leakage is considerably less.

Further, in an alternative, the circuitry includes evaluation timing circuitry interposed between the input circuitry and ground for controlling timing of the evaluation interval responsive to an evaluation signal.

Other objects and advantages of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

Figure 1:
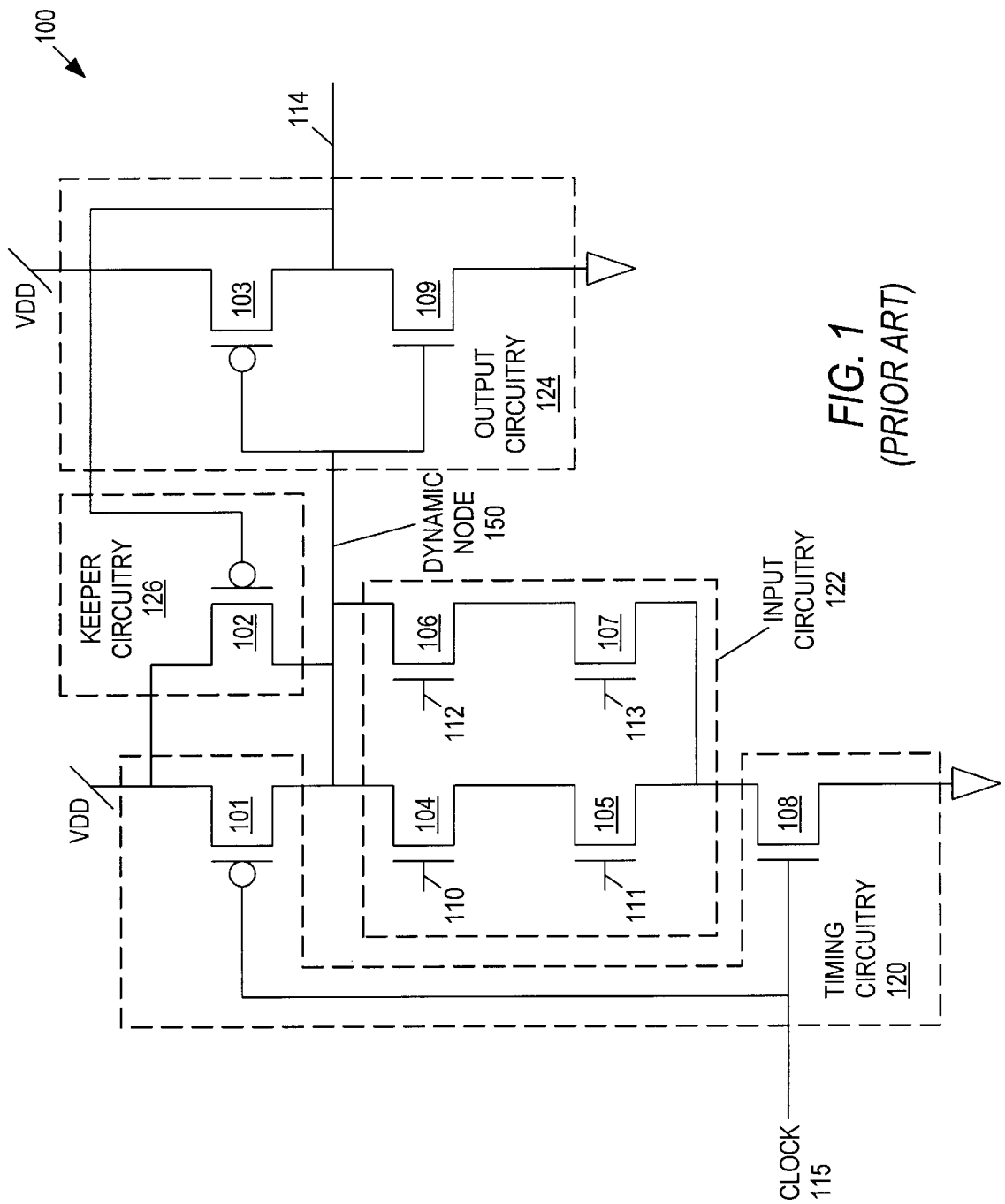
FIG. 1 illustrates a prototypical prior art dynamic logic circuit 100.
Figure 2:
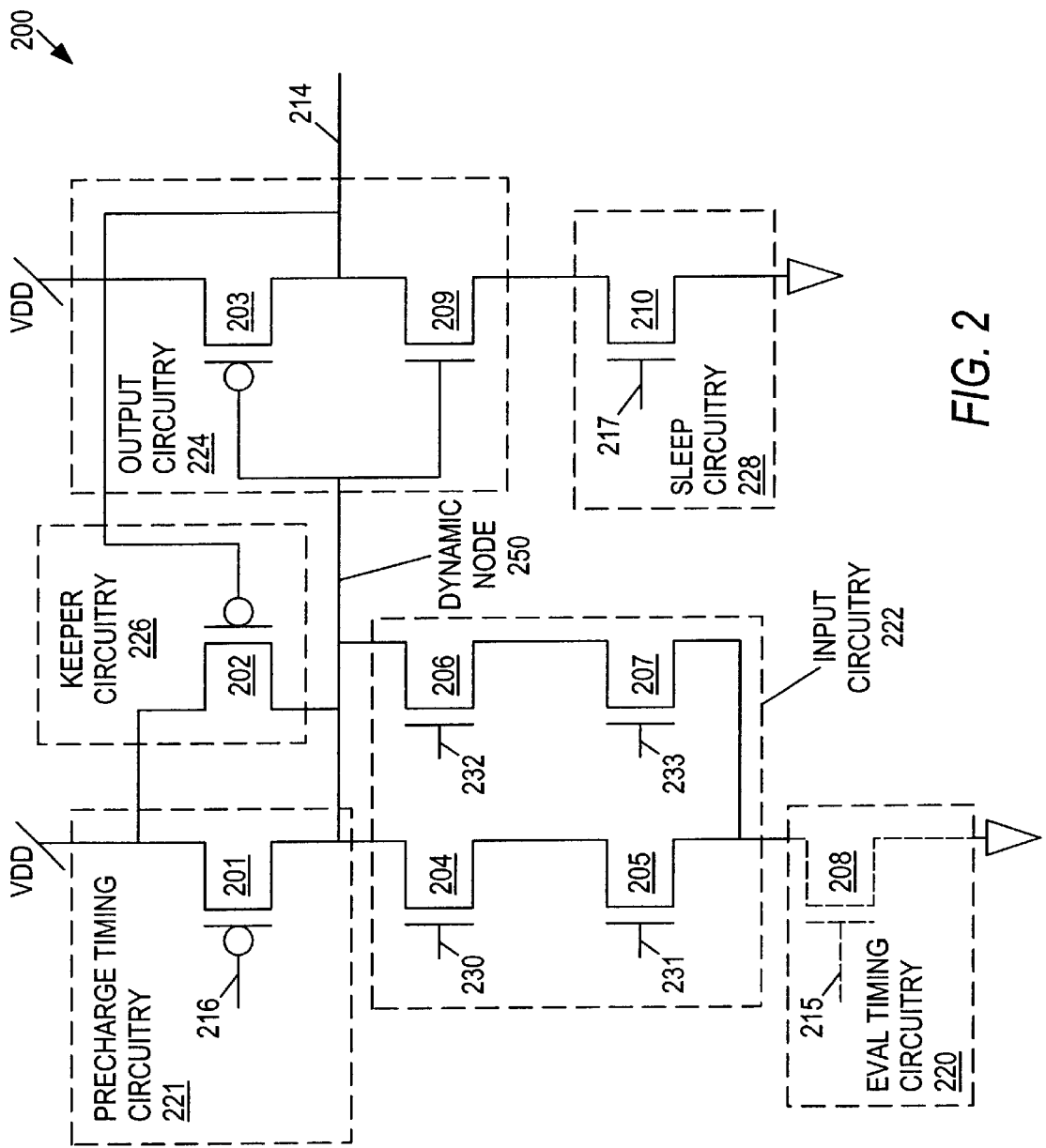
FIG. 2 illustrates a dynamic logic circuit 200, according to an embodiment of the present invention.

Referring now to FIG. 2, a dynamic logic circuit 200 is illustrated, according to an embodiment of the present invention. The circuit 200 has a dynamic node 250 which is directly coupled to precharge circuitry 221, keeper circuitry 226, output circuitry 224, and input circuitry 222. The precharge circuitry 221, keeper circuitry 226, and output circuitry 224 are each also coupled directly to Vdd, and keeper circuitry 226 is also coupled directly to the output 214 of output circuitry 224. The output circuitry 224 is also directly coupled to sleep circuitry 228, which in turn is coupled to ground. The input circuitry 222 is also directly coupled to evaluation timing circuitry 220, which in turn is coupled to ground.

Figure 3:
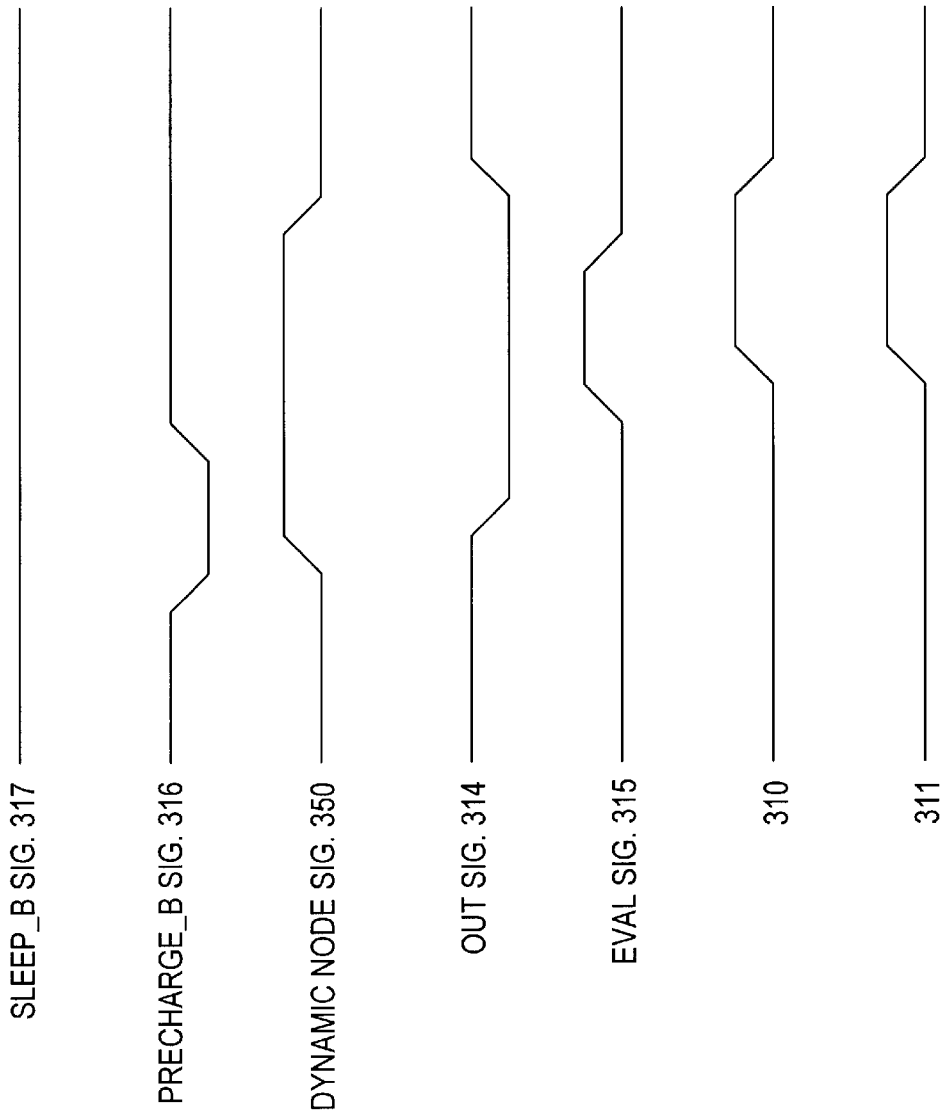
FIG. 3 illustrates timing of circuitry 200 operation for a cycle of a normal mode of operation, according to an embodiment of the invention.

Referring now to FIG. 3, timing of circuitry 200 operation is shown for a cycle of the normal mode of operation, that is, not in sleep mode. Referring also to the circuitry 200 of FIG. 2, for this normal mode NFET 210 of the sleep circuitry 228 is turned on by a high state of sleep_b signal 317, which is applied to gate 217 of NFET 210. In the precharge phase of normal operation, PFET 201 of precharge timing circuitry 221 is turned on by a low state of prech_b signal 316, which is applied to gate 216 of PFET 201, and NFET 208 of evaluation timing circuitry 220 is turned off by a low state of oval signal 315, which is applied to gate 215 of NFET 208. PFET 201 turning on charges the dynamic node signal 350 on node 250 to Vdd, which in turn, through output circuitry 224 and sleep circuitry 228 pulls down the output signal 314 on output node 214. After precharge, the prechg_b signal 316 goes high again, turning off PFET 201, but the dynamic node signal 350 is held up by keeper circuitry 226 PFET 202 due to the output signal 314 being low.

With PFET 201 of precharge timing circuitry 221 still turned off by the high state of prech_b signal 316, the evaluate phase of normal operation is initiated by eval signal 315 going high turning on NFET 208 of evaluation timing circuitry 220. Then, the input signals applied to gates 230 through 233 will have an effect. In the illustrated instance, input signal 310 applied to gate 230 and input signal 311 applied to gate 231 go high during the evaluate phase. This causes the dynamic node signal 350 to be pulled low through NFET's 204, 205 and 208, which in turn causes the output signal 314 to be pulled high through PFET 203 of the output circuitry 224, and so on.

In contrast to operation in a normal mode, in a conventional sleep mode all circuits are typically in a standby state according to which they are ready to receive inputs but are not currently receiving any, and none are driving any outputs high. If this convention were applied to the dynamic logic circuit 200 of FIG. 2, the dynamic node signal on node 250 would be driven high in the sleep mode, so that the circuit 200 would be ready to receive inputs. Correspondingly, the output signal on node 214 would be low. However, in the sleep mode of operation of the present invention, according to the embodiment, the dynamic node signal of node 250 is driven to ground, and accordingly the output signal on output node 214 is driven to Vdd. This advantageously facilitates reduced power consumption, for reasons that will be explained further herein below.

Figure 4:
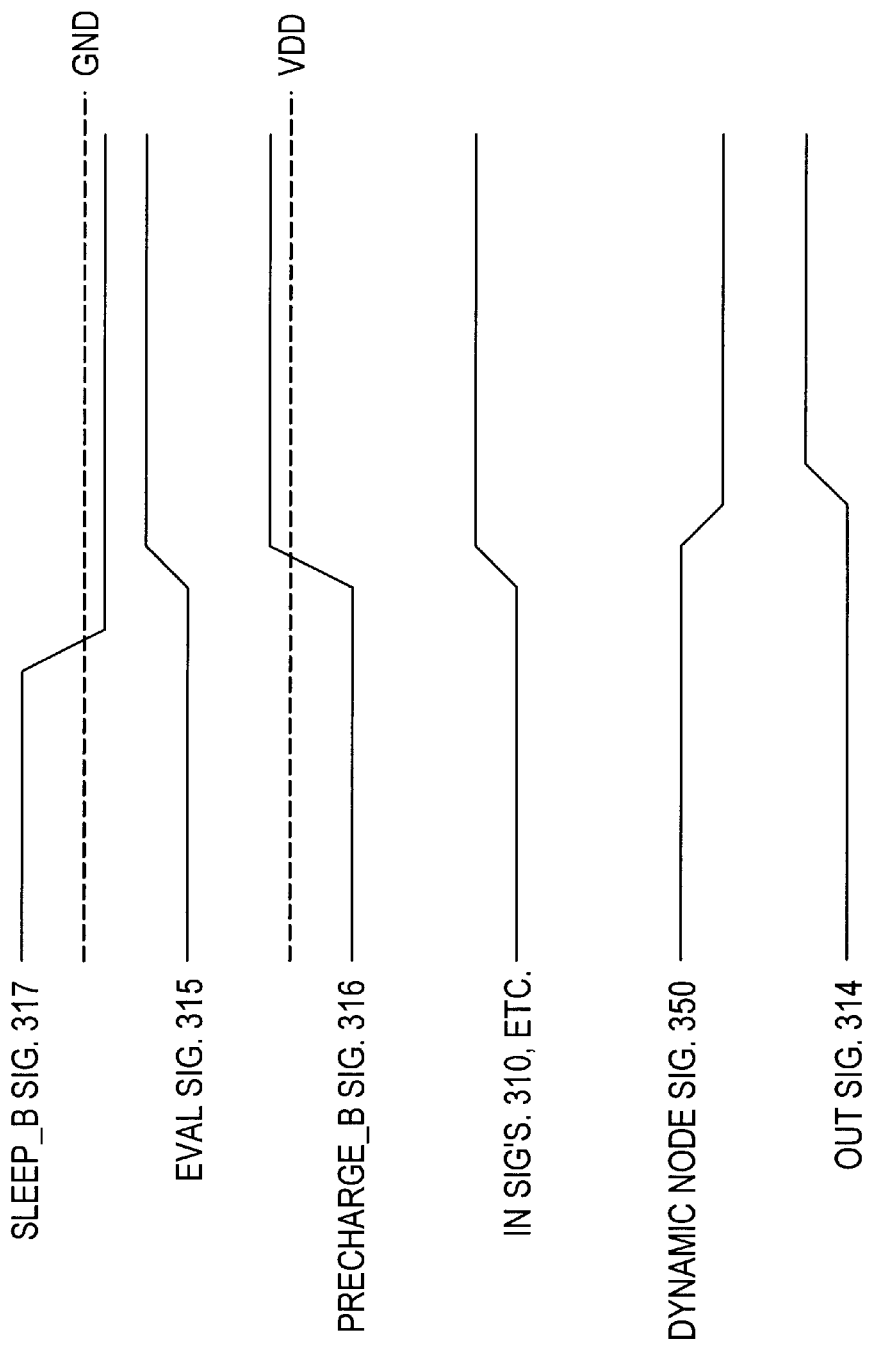
FIG. 4 illustrates timing for causing the circuit 200 to enter a low power consumption, sleep mode, according to an embodiment of the invention.

Referring now to FIG. 4, a timing diagram is shown which illustrates further aspects of the sleep mode and illustrates timing for causing the circuit 200 to enter the sleep mode, according to an embodiment of the invention. (In both FIGS. 3 and 4 it should be understood that unless otherwise noted the high state of a signal is equal to or slightly less than Vdd, the operating voltage; while the low state of a signal is equal to or slightly greater than ground voltage.) Referring also to the circuitry 200 of FIG. 2, the signals in FIG. 4 for the circuitry 200 of FIG. 2 are shown initially in a standby state in which the NFET 210 of the sleep circuitry 228 is on, the dynamic node signal 350 on node 250 is high, the output signal 314 on output node 214 is low, and no input signals 310, etc. are asserted. To enter the sleep mode, sleep_b signal 317 applied to the gate 217 of NFET 210 is de-asserted, while the evaluation signal 315 applied to gate 215 of NFET 208, the prech_b signal 316 applied to the gate 216 of PFET 201, and the inputs signals 310 through 313 applied to the gates 230 through 233 of NFET's 204 through 207 are driven high.

Note that the sleep_b signal 317 applied to gate 217 of sleep circuitry 228 NFET 210 is below ground voltage, which turns the NFET 210 off more fully than a mere ground voltage, thereby reducing any leakage current through NFET 210. Also, the signal prech_b 316 applied to the gate 216 of PFET 201 is above Vdd, which turns the PFET 201 off more fully than a mere Vdd voltage, thereby reducing any leakage current through PFET 201. Thus, in the sleep mode the dynamic node signal 350 on node 250 is pulled down to ground through NFET's 204 through 208. Because PFET 201 is more fully turned off, leakage current is reduced from Vdd to ground through the dynamic node 250, input circuitry 222 and evaluation timing circuitry 220. With the dynamic node signal 350 pulled down to ground, the output signal 314 on node 214 is pulled up to Vdd through PFET 203. Because NFET 210 is more fully turned off, leakage current is reduced from Vdd to ground through the output node 214, and NFET's 209 and 210. Note that the particular FET's 201 and 210 are situated such that they do not have a substantial effect on timing in normal operation. It is therefore advantageous to put the dynamic node 250 low and the output node 214 high in sleep mode, so that FET's 201 and 210 can be used to more fully reduced leakage current without adversely affecting timing in normal operation.

To return the circuitry 200 to the standby state, the signals 317, 315, 316, and 310, etc. are returned to their respective states shown at the initial time (on the left-hand side) in FIG. 4.

The description of the present embodiment has been presented for purposes of illustration, but is not intended to be exhaustive or to limit the invention to the form disclosed. Many additional aspects, modifications and variations are also contemplated and are intended to be encompassed within the scope of the following claims. For example, the sleep control signals sleep_b 317 and prech_b 316 need not be driven outside the normal supply ranges to make use of this method and apparatus. Doing so, however, provides additional reduction in power consumption. In another alternative, where the keeper PFET leakage is too large for the sleep mode, and additional PFET is connected with drain to source between the keeper PFET source and the Vdd supply. The gate of this additional PFET is driven above Vdd in the sleep mode, and is driven to ground during normal operation

What is claimed is:

1. Circuitry comprising:

a dynamic node;

precharge timing circuitry coupled to the dynamic node and a voltage source for driving the node to a operating voltage state during a precharge interval responsive to a precharge signal;

input circuitry coupled to the dynamic node for selectively pulling the dynamic node to a low voltage state during an evaluation interval responsive to one or more input signals;

output circuitry coupled to the dynamic node and to an output node for inverting the dynamic node voltage; and sleep circuitry coupled to the output circuitry for selectively isolating the output node from ground during a sleep interval responsive to a sleep signal, wherein the sleep signal is functionally distinct from the precharge signal.

2. The circuitry of claim 1, wherein the circuitry is operable to pull the dynamic node signal to ground and drive the output signal to the operating voltage state during the sleep interval.

3. The circuitry of claim 2, wherein responsive to the precharge signal going to a voltage level above that of the operating voltage during the sleep interval leakage current through the precharge timing circuitry is reduced during the sleep interval.

4. The circuitry of claim 2, wherein responsive to the sleep signal going to a voltage level below ground during the sleep interval leakage current through the output circuitry is reduced during the sleep interval.

5. The circuitry of claim 1, comprising:

evaluation timing circuitry interposed between the input circuitry and ground for controlling timing of the evaluation interval responsive to an evaluation signal.

6. The circuitry of claim 1, wherein the sleep circuitry comprises a cutoff transistor.

7. A method for a sleep mode in a dynamic circuit, the method comprising the steps of driving a dynamic node to an operating voltage state during a precharge interval responsive to a precharge signal by precharge timing circuitry coupled to the dynamic node and a voltage source;

pulling the dynamic node selectively to a low voltage state during an evaluation interval by input circuitry coupled to the dynamic node responsive to one or more input signals;

inverting the dynamic node voltage by output circuitry coupled to the dynamic node and to an output node; and isolating the output node from ground selectively during a sleep interval responsive to a sleep signal by sleep circuitry coupled to the output circuitry, wherein the sleep signal is functionally distinct from the precharge signal.

8. The method of claim 7, comprising the steps of:

pulling the dynamic node signal to ground during the sleep interval; and driving the output signal to the operating voltage state during the sleep interval.

9. The method of claim 8, comprising the step of driving the precharge signal to a voltage level above that of the operating voltage during the sleep interval, so that leakage current through the precharge timing circuitry is reduced during the sleep interval.

10. The method of claim 8, comprising the step of pulling the sleep signal to a voltage level below ground during the sleep interval, so that leakage current through the output circuitry is reduced during the sleep interval.

11. The method of claim 7, comprising the step of:

controlling timing of the evaluation interval by evaluation timing circuitry interposed between the input circuitry and ground.

12. The method of claim 7, wherein the sleep circuitry comprises a cutoff transistor.

* * * * *